United States Patent
Yen et al.

(10) Patent No.: US 11,631,517 B2
(45) Date of Patent: Apr. 18, 2023

(54) 8-SHAPED INDUCTIVE COIL DEVICE

(71) Applicant: Realtek Semiconductor Corporation, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 562 days.

(21) Appl. No.: 16/155,058

(22) Filed: Oct. 9, 2018

(65) Prior Publication Data

US 2019/0221350 A1 Jul. 18, 2019

(30) Foreign Application Priority Data

Jan. 15, 2018 (TW) ................................. 107101443

(51) Int. Cl.
*H01F 27/28* (2006.01)
*H01F 27/00* (2006.01)
(Continued)

(52) U.S. Cl.
CPC ....... *H01F 27/006* (2013.01); *H01F 17/0006* (2013.01); *H01F 27/2804* (2013.01);
(Continued)

(58) Field of Classification Search
CPC ............. H01F 27/2804; H01F 17/0006; H01F 17/0013; H01F 2017/0046;
(Continued)

(56) References Cited

U.S. PATENT DOCUMENTS

2012/0244802 A1* 9/2012 Feng .................... H04B 5/0087
336/225
2015/0381135 A1* 12/2015 Tsai .................... H01F 27/2804
333/175
(Continued)

FOREIGN PATENT DOCUMENTS

CN 101990690 A 3/2011
TW 201714278 A 4/2017
(Continued)

OTHER PUBLICATIONS

U.S. Appl. No. 16/129,861, filed Sep. 13, 2018.

*Primary Examiner* — Tszfung J Chan
(74) *Attorney, Agent, or Firm* — Locke Lord LLP; Tim Tingkang Xia, Esq.

(57) ABSTRACT

An 8-shaped inductive coil device that includes a first and a second spiral coils and a connection segment structure is provided. The first spiral coil includes first metal segments and crossing connection segments disposed at a first and a second metal layers respectively and includes first connection terminals. The second spiral coil includes second connection terminals. The connection segment structure electrically couples the first and the second connection terminals. The first and the second spiral coils are disposed along an imaginary line passing through a central region of each of ranges surrounded by the first and the second spiral coils. The connection segment structure and the crossing connection segments electrically couple the part of the first metal segments substantially vertical to the imaginary line, and the connection segment structure and the crossing connection segments are disposed substantially on the imaginary line.

8 Claims, 6 Drawing Sheets

(51) Int. Cl.
  *H01L 49/02*   (2006.01)
  *H01F 27/29*   (2006.01)
  *H01F 17/00*   (2006.01)

(52) U.S. Cl.
  CPC ............. *H01F 27/29* (2013.01); *H01L 28/10* (2013.01); *H01F 2017/0073* (2013.01); *H01F 2027/2819* (2013.01)

(58) Field of Classification Search
  CPC .. H01F 2027/2809; H01F 5/003; H01F 27/29; H01F 2027/2819; H01L 28/10; H01L 23/5227
  USPC ..................... 336/192, 200, 223, 226, 232
  See application file for complete search history.

(56) References Cited

U.S. PATENT DOCUMENTS

2016/0035671 A1*  2/2016  Huang ............... H01F 17/0006
                                                   336/200
2016/0225509 A1*  8/2016  Mattsson ................ H04B 1/16
2017/0098500 A1   4/2017  Yen et al.

FOREIGN PATENT DOCUMENTS

| TW | I591800 B | 7/2017 | |
|----|-----------|--------|---|
| TW | 107107742 | 3/2018 | |
| TW | I632661 B | 8/2018 | |
| WO | WO-2009125324 A1 * | 10/2009 | ......... H01F 17/0006 |

* cited by examiner

8-SHAPED INDUCTIVE COIL DEVICE

RELATED APPLICATIONS

This application claims priority to Taiwan Application Serial Number 107101443, filed Jan. 15, 2018, which is herein incorporated by reference.

BACKGROUND

Field of Invention

The present invention relates to an inductive coil technology. More particularly, the present invention relates to an 8-shaped inductive coil device.

Description of Related Art

Inductive coils, such as inductors or transformers are often used in various kinds of circuits. The inductors are electrical components configured to generate electromotive force due to the change of the amount of current passing through to resist the change of the amount of current. The transformers are devices configured to increase or decrease a voltage by applying the law of electromagnetic induction. In current integrated circuit designs, an 8-shaped inductive coil device is often used to implement an inductor or a transformer. However, under the requirement of smaller area of the integrated circuit, the area of the inductive coil device needs to be shrunk as well without affecting the inductance thereof.

Accordingly, what is needed is an 8-shaped inductive coil device to address the issues mentioned above.

SUMMARY

An aspect of the present invention is to provide an 8-shaped inductive coil device that includes a first spiral coil, a second spiral coil and a connection segment structure. The first spiral coil includes a plurality of first metal segments and a plurality of crossing connection segments disposed at a first metal layer and a second metal layer respectively and comprising at least a pair of first connection terminals. The second spiral coil includes at least a pair of second connection terminals. The connection segment structure is configured to electrically couple the first connection terminals and the second connection terminals. The first spiral coil and the second spiral coil are disposed neighboring to each other along an imaginary line passing through a central region of each of ranges respectively surrounded by the first second spiral coil and the second spiral coil, the connection segment structure and the crossing connection segments electrically couple a part of the first metal segments substantially vertical to the imaginary line, and the connection segment structure and the crossing connection segments are disposed substantially on the imaginary line.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In order to make the objects, technical solutions and advantages of the present disclosure apparent, diagrams in combination of examples are used to describe the present disclosure in further detail. It should be understood that the specific embodiments described herein are merely examples for explaining the present disclosure and are not intended to limit the present disclosure.

Figure 1A:
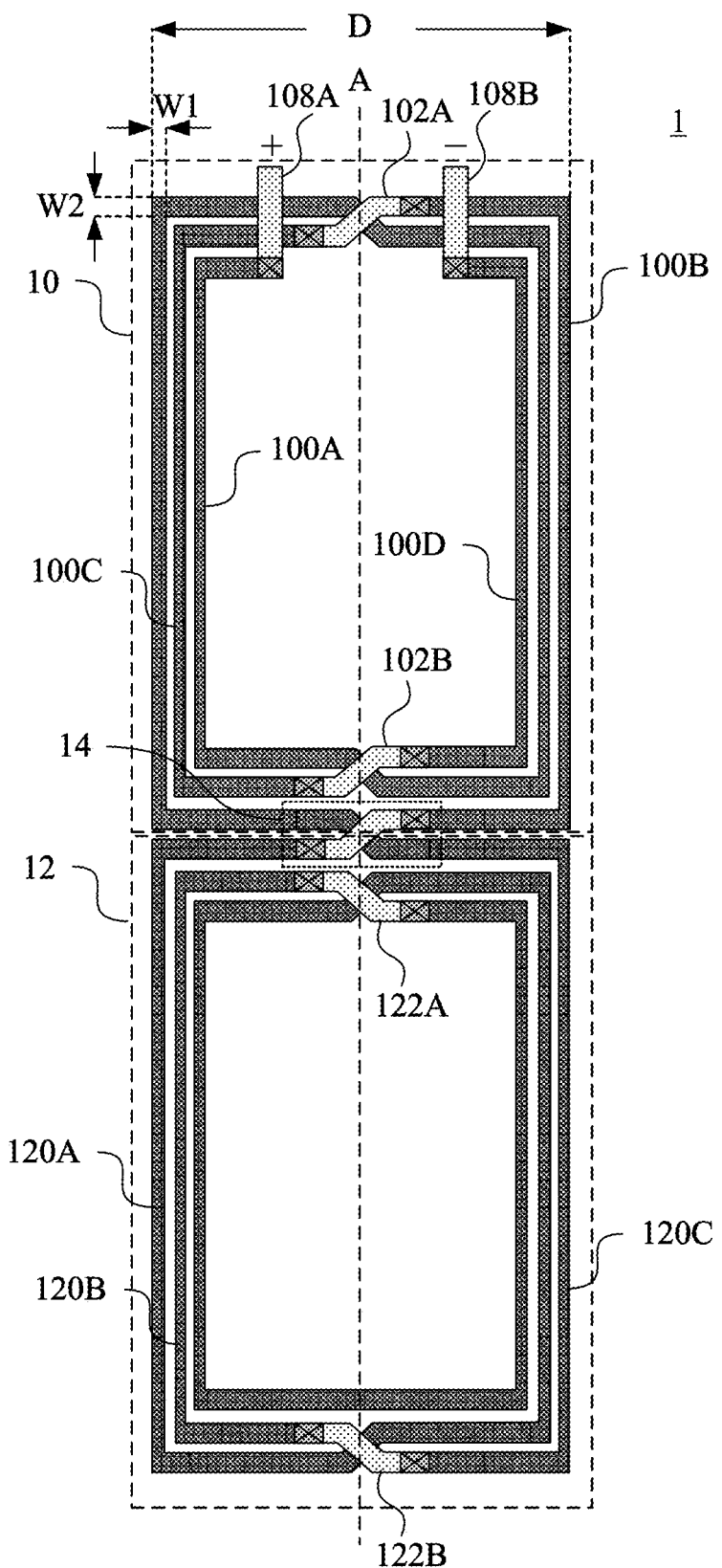
FIG. 1A is a diagram of an 8-shaped inductive coil device in an embodiment of the present invention.
Figure 1B:
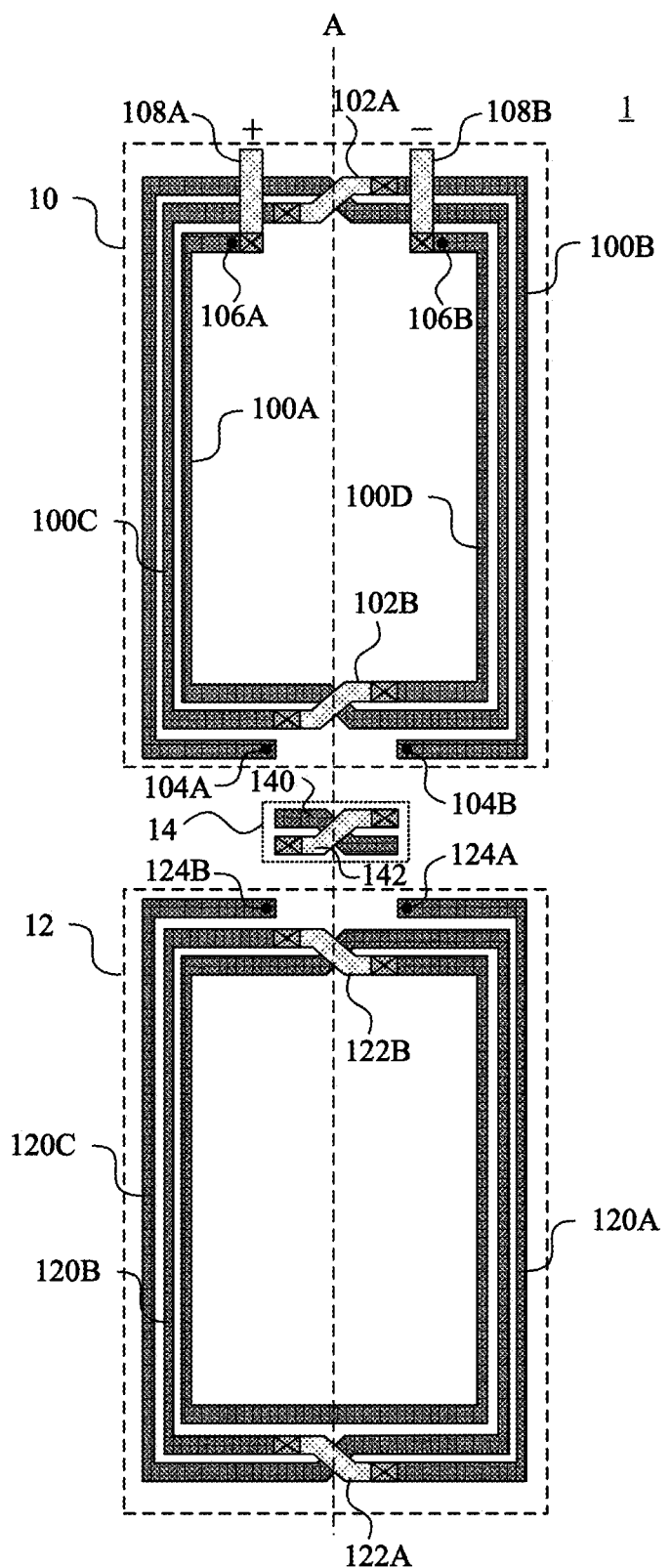
FIG. 1B is a diagram of the 8-shaped inductive coil device in FIG. 1A, in which the first spiral coil, the second spiral coil and the connection segment structure are illustrated separately in an embodiment of the present invention.

Reference is now made to FIG. 1A and FIG. 1B. FIG. 1A is a diagram of an 8-shaped inductive coil device 1 in an embodiment of the present invention. The 8-shaped inductive coil device 1 includes a first spiral coil 10, a second spiral coil 12 and a connection segment structure 14.

FIG. 1B is a diagram of the 8-shaped inductive coil device 1 in FIG. 1A, in which the first spiral coil 10, the second spiral coil 12 and the connection segment structure 14 are illustrated separately in an embodiment of the present invention.

The first spiral coil 10 includes a plurality of first metal segments 100A-100D and a plurality of crossing connection segments 102A-102B. The first metal segments 100A-100D are disposed at a first metal layer and the crossing connection segments 102A-102B are disposed at a second metal layer. In the present embodiment, the first metal layer and the second metal layer are adjacent to each other and are illustrated as blocks with slashes and blocks with dots respectively.

The crossing connection segment 102A is configured to cross the first metal segment 100A and electrically couple the first metal segment 1008 and the first metal segment 100C. The crossing connection segment 102B is configured to cross the first metal segment 100A and electrically couple the first metal segment 100C and the first metal segment 100D.

The first spiral coil 10 includes two firs connection terminals 104A and 104B. The first connection terminal 104A is disposed at the first metal segment 100A and the first connection terminal 104B is disposed at the first metal segment 100B.

Further, the first spiral coil 10 includes a pair of voltage input and output terminals 106A and 106B. The voltage input and output terminal 106A is disposed at the first metal segment 100A and is actually a voltage input positive terminal (depicted as a symbol '+' in FIG. 1A and FIG. 1B). In an embodiment, the voltage input and output terminal 106A is electrically coupled to an external circuit through such as, but not limited to an input and output metal segment 108A disposed at the second metal layer.

The voltage input and output terminal 10BA is disposed at the first metal segment 100D and is actually a voltage input negative terminal (depicted as a symbol '−' in FIG. 1A and FIG. 1B). In an embodiment, the voltage input and output terminal 106B is electrically coupled to an external circuit through such as, but not limited to an input and output metal segment 108B disposed at the second metal layer.

The configuration of the second spiral coil 12 is similar to the configuration of the first spiral coil 10. However, no voltage input and output terminal is disposed at the second spiral coil 12. Further, the second spiral coil 12 includes three first metal segments 120A-120C disposed at the first metal layer, and crossing connection segments 122A-122B respectively configured to electrically couple the first metal segments 120A and 120B and electrically couple the first metal segments 122A and 122B.

The second spiral coil 12 includes two second connection terminals 124A and 124B. The second connection terminal 124A is disposed at the first metal segment 120A, and the second connection terminal 124B is disposed at the first metal segment 120C.

The connection segment structure 14 is configured to electrically couple the first connection terminals 104A and 104B and the second connection terminals 124A and 124B. In the present embodiment, the connection segment structure 14 includes a first connection metal segment 140 disposed at the first metal layer and a second connection metal segment 142 disposed at the second metal layer that crosses over the first connection metal segment 140.

The first connection metal segment 140 is configured to electrically couple the first connection terminal 104A and the second connection terminal 124A, and the second connection metal segment 142 is configured to electrically couple the first connection terminal 104B and the second connection terminal 124B.

In the present embodiment, the 8-shaped inductive coil device 1 is an inductor device. The first spiral coil 10 and the second spiral coil 12 respectively include a plurality of loops, such as but not limited to three loops in the present embodiment.

More specifically, when the voltage input and output terminal 106A is the starting terminal, the first metal segment 100A forms the innermost loop on the left side, extends to the right side to form the central loop, further extends to the left side to form the outermost loop and electrically couple to the second connection terminal 124A at the first metal segment 120A of the second spiral coil 12 through the first connection metal segment 140 of the connection segment structure 14 by using the first connection terminal 104A.

The first metal segment 120A forms the outermost loop of the second spiral coil 12 on the right side, electrically couples to the first metal segment 120B through the crossing connection segment 122A to form the central loop on the left side, electrically couples to the first metal segment 120C through the crossing connection segment 122B to form the innermost loop on the right side, extends to the left side to form the innermost loop, extends to the right side to form the central loop, extends to the left side to form the outermost loop and electrically couples to the first connection terminal 104B at the first metal segment 100B of the first spiral coil 10 through the second connection metal segment 142 of the connection segment structure 14 by using the second connection terminal 124B.

The first metal segment 100B forms outermost loop of the first spiral coil 10 on the right side, electrically couples to the first metal segment 100C through the crossing connection segment 102A to form the central loop on the left side, electrically coupled to the first metal segment 100D through the crossing connection segment 102B to form the innermost loop on the right side and arrives the voltage input and output terminal 106B that acts as the end terminal.

In an embodiment, each of the crossing connection segments 102A, 102B, 122A and 122B and the connection segment structure 14 can use contact or via to electrically couple two first metal segments.

It is appreciated that the number of loops and the structure of the windings of the first spiral coil 10 and the second spiral coil 12 are merely an example. In other embodiments, different numbers of loops and different structures of the windings can be used to implement the first spiral coil 10 and the second spiral coil 12.

In the present embodiment, the first spiral coil 10 and the second spiral coil 12 are disposed neighboring to each other along an imaginary line A passing through a central region of each of ranges respectively surrounded by the first second spiral coil 10 and the second spiral coil 12. Taking the first spiral coil 10 as an example, the crossing connection segments 102A, 102B and the connection segment structure 14 electrically couple the part of the first metal segments that is substantially vertical to the imaginary line A.

For example, the crossing connection segment 102A electrically couples the part of the first metal segments 100B and 100C that is substantially vertical to the imaginary line A. The crossing connection segment 102B electrically couples the part of the first metal segments 100C and 100D that is substantially vertical to the imaginary line A. The connection segment structure 14 electrically couples the part of the first metal segments 100A and 100B that is substantially vertical to the imaginary line A. It is appreciated that the term "substantially" means that the part of the first metal segments is not necessarily completely vertical to the imaginary line A and may have a slight deviation within a reasonable range.

Further, the crossing connection segments 102A, 102B and the connection segment structure 14 are disposed substantially on the imaginary line A. It is appreciated that the term "substantially" means that the crossing connection segments 102A, 102B and the connection segment structure 14 are not necessarily exactly aligned to the imaginary line A and may have a slight deviation within a reasonable range.

In an embodiment, the second spiral coil 12 includes the configuration similar to the first spiral coil 10. As a result, the detail configuration of second spiral coil 12 is not described herein.

By using the configuration of the 8-shaped inductive coil device 1 illustrated in FIG. 1A and FIG. 1B, the crossing connection segments 102A, 102B, 122A and 122B and the connection segment structure 14 are disposed at the part of the first metal segments that are substantially vertical to the to the imaginary line A and are disposed around the imagery line A that passes through the central region. As a result, the width D of the 8-shaped inductive coil device 1 along a direction vertical to the imaginary line A can be greatly reduced. The area of the whole 8-shaped inductive coil device 1 can be further reduced.

In an embodiment, each of the first metal segments 100A-100C includes a first part that is parallel to the imaginary line A and a second part that is vertical to the imaginary line A. A first width (e.g. the width W1 illustrated in FIG. 1A) of the first part of the first metal segments 100A-100C is smaller than a second width (e.g. the width W2 illustrated in FIG. 1A) of the second part of the first metal segments 100A-100C. In an embodiment, the width W1 and the width W2 can respectively be such as, but not limited to 2 micrometers and 4 micrometers.

As a result, by designing the metal segments having different widths, the width D of the 8-shaped inductive coil device 1 along the direction vertical to the imaginary line A and the whole area of the 8-shaped inductive coil device 1 can be greatly reduced.

Figure 2A:
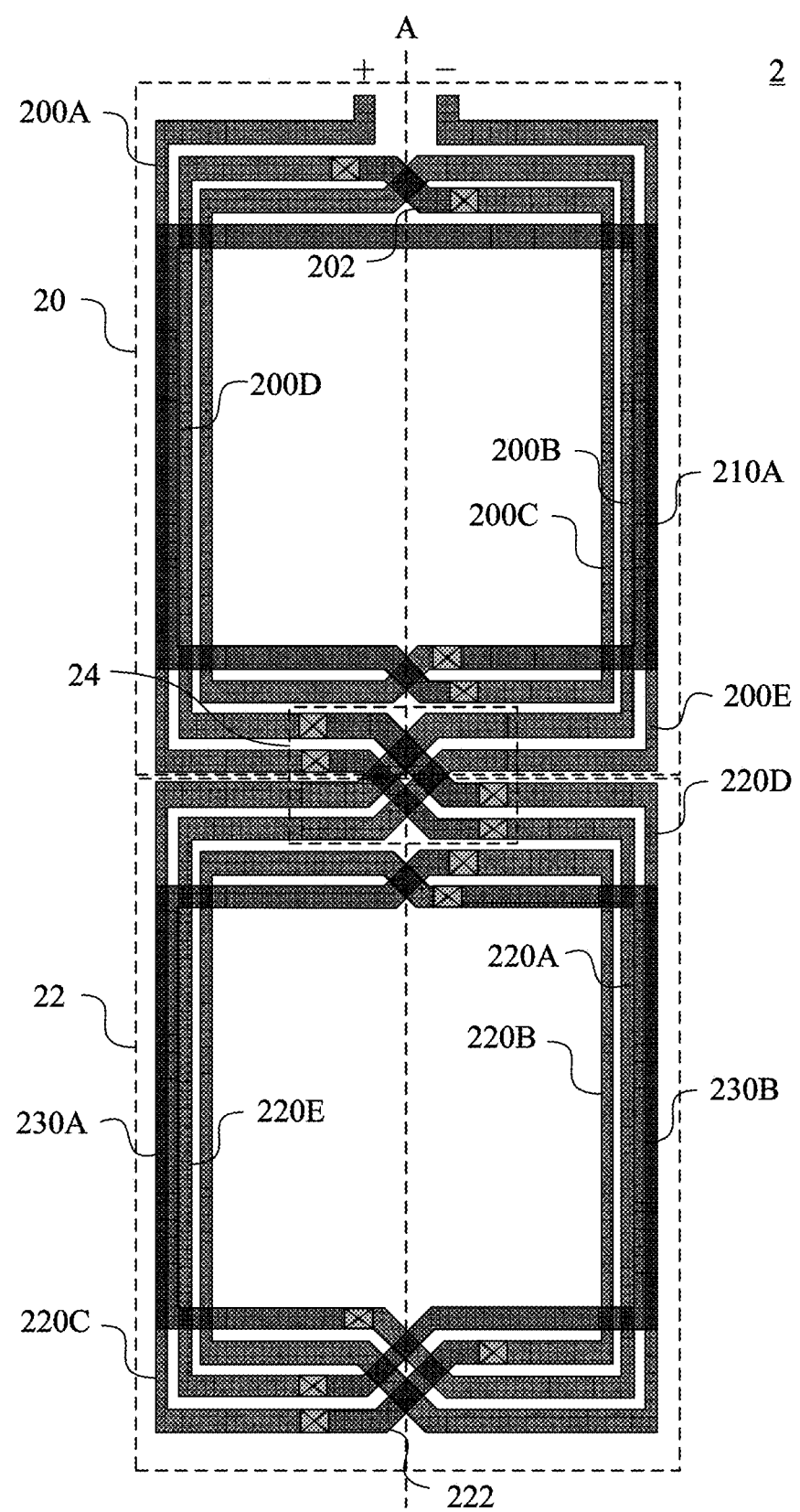
FIG. 2A is a 8-shaped inductive coil device in an embodiment of the present invention.
Figure 2B:
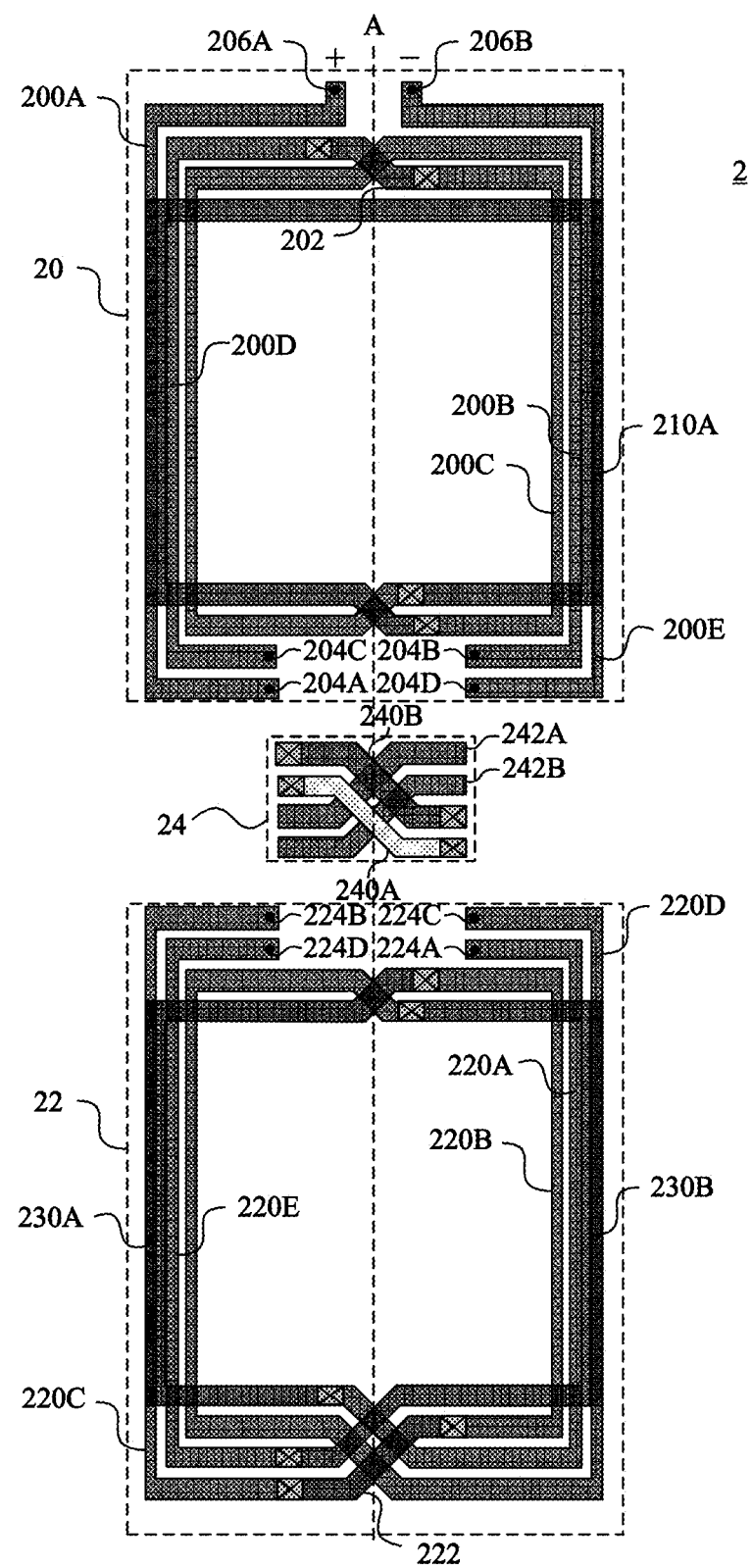
FIG. 2B is a diagram of the 8-shaped inductive coil device in FIG. 2A, in which the first spiral coil, the second spiral coil and the connection segment structure are illustrated separately in an embodiment of the present invention.

Reference is now made to FIG. 2A and FIG. 2B. FIG. 2A is a 8-shaped inductive coil device 2 in an embodiment of the present invention. In the present embodiment, the 8-shaped inductive coil device 2 is an inductor device and includes a first spiral coil 20 and a second spiral coil 22 that are disposed along with an imaginary line A and a connection segment structure 24.

FIG. 2B is a diagram of the 8-shaped inductive coil device 2 in FIG. 2A, in which the first spiral coil 20, the second spiral coil 22 and the connection segment structure 24 are illustrated separately in an embodiment of the present invention.

Similar to the 8-shaped inductive coil device 1 illustrated in FIG. 1A and FIG. 1B, the first spiral coil 20 includes a plurality of first metal segments 200A-200E disposed at the first metal layer and the crossing connection segment 202 disposed at the second metal layer and configured to electrically couple the first metal segments 200C and 200D. However, the first spiral coil 20 in the present embodiment further includes a second metal segment 210A disposed at the second metal layer. The second metal segment 210A electrically couples the first metal segments 200B and 200C.

The first spiral coil 20 includes four first connection terminals 204-204D disposed at the first metal segments 200A, 200B, 200D and 200E respectively. Further, the first spiral coil 20 includes a pair of voltage input and output terminals 206A and 206B that are disposed at the first metal segments 200A and 200E respectively and are a voltage input positive terminal and a voltage output negative terminal respectively (labeled as symbols '+' and '−' respectively in FIG. 2A and FIG. 2B).

The first metal segments 200A-200E include a first part that is parallel to the imaginary line A and a second part that is vertical to the imaginary line A. The second segment 210A includes a third part that is parallel to the imaginary line A and a fourth part that is vertical to the imaginary line A. The third part of the second segment 210A overlaps the first part of the first metal segments 200A-200E, and the fourth part of the second segment 210A is separated from the second part of the first metal segments 200A-200E by a distance without overlapping the second part of the first metal segments 200A-200E.

The configuration of the second spiral coil 22 is similar to the configuration of the first spiral coil 20. The second spiral coil 22 includes a plurality of first metal segments 220A-220E, the crossing connection segment 222 that electrically couples the first metal segments 220B and 220C, and a plurality of second metal segments 230A and 230B. The second spiral coil 22 includes four second connection terminals 224A-224D disposed at the first metal segments 220A, 220C, 220D and 220E respectively. The part of the second metal segments 230A and 230B that is parallel to the imaginary line A overlaps the part of the first metal segments 220A-220E that is parallel to the imaginary line A. The part of the second metal segments 230A and 230B that is vertical to the imaginary line A is separated from the part of the first metal segments 220A-220E that is vertical to the imaginary line A by a distance without overlapping the part of the first metal segments 220A-220E that is vertical to the imaginary line A.

The connection segment structure 24 includes a plurality of first connection metal segments 240A and 240B and a plurality of second connection metal segments 242A and 242B. The first connection metal segments 240A and 240B electrically couples the first metal segments 200A and 220A and electrically couples the first metal segments 200D and 220D respectively. The second connection metal segments 242A and 242B electrically couples the first metal segments 200B and 220C and electrically couples the first metal segments 200E and 220E respectively.

Each of the first spiral coil 20 and the second spiral coil 22 includes four loops. The detail of the configuration of the connection thereof is not described herein. It is appreciated that, taking the first spiral coil 20 as an example, besides the three loops from the inner loop to the outer loop formed in the first metal layer by the first metal segments 220A-220E, the first spiral coil 20 further includes another loop overlaps the three loops formed by the second metal segment 210A.

By using the stack design formed by different layers of metal segments, a coupling effect is generated between overlapping metal layers in the 8-shaped inductive coil device 2. The inductance is thus increased.

In an embodiment, a width of the first part of the first metal segments 220A-220E that is parallel to the imaginary line A is smaller than a width of the second part of the first metal segments 220A-220E that is vertical to the imaginary line A. The width of the second metal segment 210A can be the same with the width of the second part of the first metal segments 220A-220E that is vertical to the imaginary line A.

It is appreciated that the width of the first part of the first metal segments 220A-220E is designed to be smaller in order to shrink the area. However, the smaller width results in a higher resistance of the metal segment to further reduce the quality factor Q (equivalent to the inductance and the resistance). As a result, since the second metal segment 210A only forms a single loop, a larger width can be maintained to reduce the resistance thereof and increase the quality factor Q.

As a result, in an embodiment, when the 8-shaped inductive coil device includes two layers of loops, the number of the loops formed by the second metal segments is preferably smaller than the number of the loops formed by the first metal segments.

Figure 3:
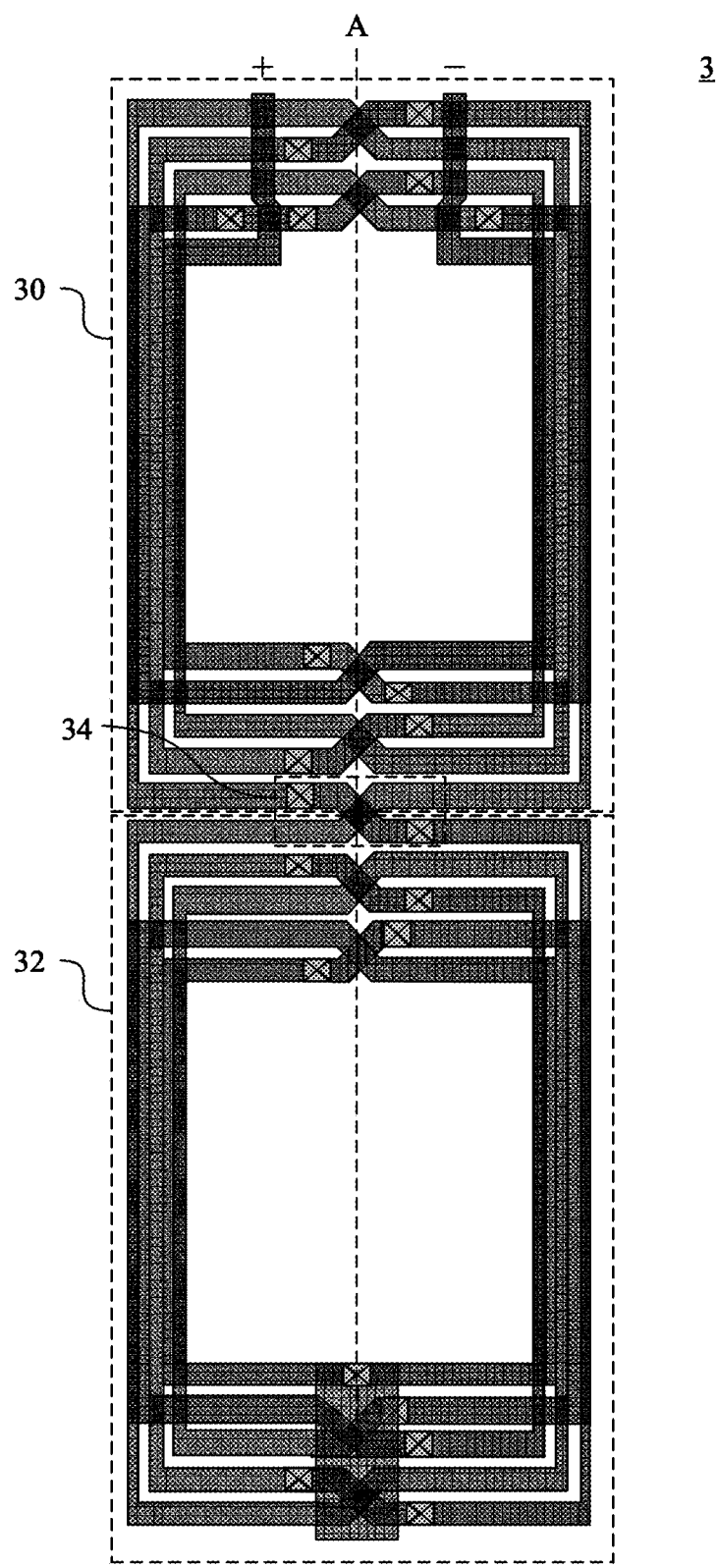
FIG. 3 is a diagram of an 8-shaped inductive coil device in an embodiment of the present invention.

Reference is now made to FIG. 3. FIG. 3 is a diagram of an 8-shaped inductive coil device 3 in an embodiment of the present invention. In the present embodiment, the 8-shaped inductive coil device 3 is an inductor device and includes a first spiral coil 30 and a second spiral coil 32 that are disposed along with an imaginary line A and a connection segment structure 34.

Similar to the 8-shaped inductive coil device 2 illustrated in FIG. 2A and FIG. 2B, the first spiral coil 30 and the second spiral coil 32 of the 8-shaped inductive coil device 3 can be formed by two layers of metal segments and can be electrically coupled by using the connection segment structure 34. Further, the crossing connection segments (not labeled) in the first spiral coil 30 and the second spiral coil 32 and the connection segment structure 34 can be configured to electrically couple the metal segments that are vertical to the imaginary line A and are substantially disposed on the imaginary line A. The detail of the configuration of the connection of the first spiral coil 30 and the second spiral coil 32 is not described herein.

It is appreciated that in the present embodiment, the number of the loops formed by the metal segments of the second metal layer (illustrated as blocks with dots) is two. Further, the voltage input positive terminal and the voltage output negative terminal (labeled as symbols '+' and '−' respectively in FIG. 3) are disposed at the metal segments of the second metal layer.

Furthermore, in the present embodiment, the 8-shaped inductive coil device 3 further includes a central tap 36 formed at the third metal layer illustrated as blocks with straight lines and electrically coupled to the metal segments of the second metal layer. It is appreciated that in different embodiments, the central tap can be formed by using different methods depending on the requirements. The present invention is not limited thereto.

Figure 4:
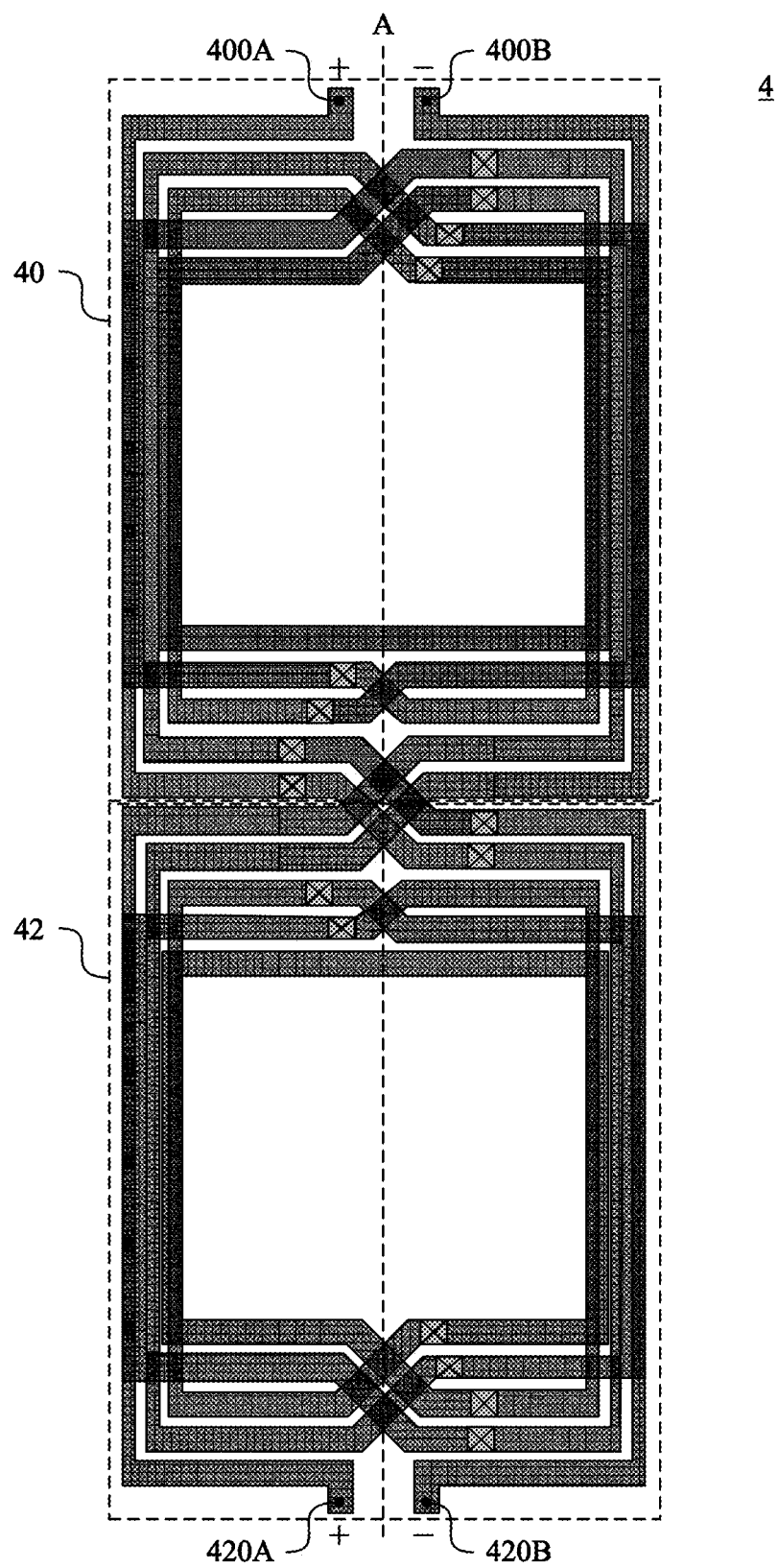
FIG. 4 is a diagram of an 8-shaped inductive coil device in an embodiment of the present invention.

Reference is now made to FIG. 4. FIG. 4 is a diagram of an 3-shaped inductive coil device 4 in an embodiment of the present invention. In the present embodiment, the 8-shaped inductive coil device 4 is a transformer device and includes a first spiral coil 40 and a second spiral coil 42 that are disposed along with an imaginary line A and a connection segment structure 44.

Similar to the 8-shaped inductive coil device 2 illustrated in FIG. 2A and FIG. 2B, the first spiral coil 40 and the second spiral coil 42 of the 8-shaped inductive coil device 4 can be formed by two layers of metal segments and can be electrically coupled by using the connection segment structure 44. Further, the crossing connection segments (not labeled) in the first spiral coil 40 and the second spiral coil 42 and the connection segment structure 44 can be configured to electrically couple the metal segments that are vertical to the imaginary line A and are substantially disposed on the imaginary line A. The detail of the configuration of the connection of the first spiral coil 40 and the second spiral coil 42 is not described herein.

In the present embodiment, the first spiral coil 40 includes a pair of first voltage input and output terminals 400A and 400B that are the voltage input positive terminal and the voltage output negative terminal respectively (labeled as symbols '+' and '−' respectively in FIG. 4). The second spiral coil 42 includes a pair of second voltage input and output terminals 420A and 420B that are the voltage input positive terminal and the voltage output negative terminal respectively (labeled as symbols '+' and '−' respectively in FIG. 4).

A part of the first metal segments (illustrated as blocks with backslashes) of the first metal layer of the first spiral coil 40 is electrically coupled to the first voltage input and output terminals 400A and 400B and is electrically coupled to the first metal segments (also illustrated as blocks with backslashes) of the first metal layer and the second metal segments (illustrated as dark-colored blocks with dots) of the second metal layer in the second spiral coil 42 through the connection segment structure 44. A first coil of the transformer is therefore formed.

The other part of the first metal segments (illustrated as blocks with slashes) of the first metal layer of the first spiral coil 40 uses the second metal segments (illustrated as light-colored blocks with dots) of the second metal layer to be electrically coupled to the second voltage input and output terminals 420A and 420B through the connection segment structure 44 and the first metal segments (also illustrated as blocks with slashes) of the first metal layer of the second spiral coil 42. A second coil of the transformer is therefore formed.

As a result, the design of the 8-shaped inductive coil device of the present invention can be applied to both the inductor device and the transformer device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An 8-shaped inductive coil device comprising:
a first spiral coil comprising a plurality of first metal segments and a plurality of crossing connection segments disposed at a first metal layer and a second metal layer respectively and comprising at least a pair of first connection terminals, wherein the first metal layer and the second metal layer are adjacent to each other;
a second spiral coil comprising at least a pair of second connection terminals; and
a connection segment structure configured to electrically couple the first connection terminals and the second connection terminals;
wherein the first spiral coil and the second spiral coil are disposed neighboring to each other along an imaginary line passing through a central region of each of ranges respectively surrounded by the first spiral coil and the second spiral coil, the connection segment structure and the crossing connection segments electrically couple a part of the first metal segments vertical to the imaginary line, and the connection segment structure and the crossing connection segments are disposed on the imaginary line, wherein one of the crossing connection segments is directly adjacent to the connection segment structure, wherein the first metal segments comprise a first part that is parallel to the imaginary line and a second part that is vertical to the imaginary line, wherein the first spiral coil further comprises at least one second metal segment disposed at the second metal layer configured to electrically couple two of the first metal segments; wherein the second metal segment comprises a third part that is parallel to the imaginary line and a fourth part that is vertical to the imaginary line, and the third part of the second metal segment overlaps the first part of the first metal segments and fourth part of the second metal segment is separated from the second part of the first metal segments by a distance without overlapping the second part of the first metal segments.

2. The 8-shaped inductive coil device of claim 1, wherein a first width of the first part of the first metal segments is smaller than a second width of the second part of the first metal segments.

3. The 8-shaped inductive coil device of claim 1, wherein a first width of the first part is respectively smaller than a second width of the second part, a third width of the third part and a fourth width of the fourth part.

4. The 8-shaped inductive coil device of claim 1, wherein the first spiral coil comprises a plurality of loops, wherein a second number of the loops formed by the second metal segment is smaller than a first number of the loops formed by the first metal segments.

5. The 8-shaped inductive coil device of claim 1, wherein the 8-shaped inductive coil device is an inductor device and the first spiral coil further comprises a pair of voltage input and output terminals.

6. The 8-shaped inductive coil device of claim 1, wherein the connection segment structure comprises at least one first connection metal segment disposed at the first metal layer and at least one second connection metal segment disposed at the second metal layer that crosses over the first connection metal segment.

7. The 8-shaped inductive coil device of claim 1, wherein the 8-shaped inductive coil device is a transformer device and the first spiral coil further comprises a pair of first voltage input and output terminals and the second spiral coil further comprises a pair of second voltage input and output terminals;
   wherein a part of the first metal segments electrically couple to the first voltage input and output terminals and form a first coil together with a first part metal segment of the second spiral coil, the other part of the first metal segments electrically couple to the second voltage input and output terminals through a second part metal segment of the second spiral coil to form a second coil.

8. The 8-shaped inductive coil device of claim 7, wherein the first spiral coil further comprises at least one second metal segment disposed at the second metal layer and configured to electrically couple two of the first metal segment.

\* \* \* \* \*